US007853908B2

(12) United States Patent
Kim et al.

(10) Patent No.: US 7,853,908 B2
(45) Date of Patent: Dec. 14, 2010

(54) ALGORITHMIC REACTIVE TESTBENCH FOR ANALOG DESIGNS

(75) Inventors: Jang Dae Kim, San Jose, CA (US);
Steve A. Martinez, Tucson, AZ (US);
Satya N. Mishra, Fort Collins, CO (US);
Alan P. Bucholz, Fort Collins, CO (US);
Hui X. Li, Antioch, CA (US); Rajesh R. Berigei, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 15 days.

(21) Appl. No.: 11/899,215

(22) Filed: Sep. 5, 2007

(65) Prior Publication Data
US 2009/0064063 A1    Mar. 5, 2009

(51) Int. Cl.
*G06F 17/50*    (2006.01)
*G06F 9/45*    (2006.01)
(52) U.S. Cl. .................... 716/5; 716/4; 716/6; 716/18; 703/3; 703/13; 703/14; 714/740; 714/741
(58) Field of Classification Search ................. 716/4–6, 716/18; 703/13–14; 714/740–741
See application file for complete search history.

(56) References Cited

U.S. PATENT DOCUMENTS

| | | | |
|---|---|---|---|
| 7,191,112 B2* | 3/2007 | Demler et al. ................ | 703/14 |
| 2003/0103137 A1* | 6/2003 | Espertshuber et al. ......... | 348/87 |
| 2004/0044509 A1* | 3/2004 | Demler et al. ................ | 703/14 |
| 2007/0214438 A1* | 9/2007 | Chen et al. .................... | 716/4 |

* cited by examiner

*Primary Examiner*—Nghia M Doan
(74) *Attorney, Agent, or Firm*—Dergosits & Noah LLP

(57) ABSTRACT

An Algorithmic Reactive Testbench (ART) system is provided for the simulation/verification of an analog integrated circuit design. The ART system is a high level simulation/verification environment with a user program in which one or more analog testbenches are instantiated and operated as prescribed in an algorithmic reactive testbench program, and the properties of the unit testbenches (test objects) can be influenced by prior analysis of themselves or other tests. The test object may also contain various properties including information reflecting the status of the test object. The modification of a property of a test object is an act of communication in the ART system from the algorithmic reactive testbench program to the test object.

3 Claims, 1 Drawing Sheet

ALGORITHMIC REACTIVE TESTBENCH FOR ANALOG DESIGNS

FIELD OF THE INVENTION

The present invention relates to simulation/verification techniques for semiconductor integrated circuits and, in particular, to a simulation/verification environment with one or more analog testbenches.

DISCUSSION OF THE RELATED ART

A testbench is a complete verification environment that applies stimulus to and checks the response from a semiconductor integrated circuit design, often referred to as a "device under test" or DUT for short. The testbench is connected to the DUT to engage in testing. Thus, for purposes of discussion herein, the DUT is considered a part of the testbench.

A testbench of an analog integrated circuit design consists of an analog design (DUT) and its surrounding circuitry to drive and monitor the design (DUT). The testbench is represented as a netlist for testing by simulation.

An analog test encompasses an analog simulation setup (including the testbench and simulation environment), the simulation run (i.e., execution) and the simulation results analysis. The test (and testbench) is self-contained in the sense that the simulation runs without any further external input that can affect the simulation. A test specification is the test except the actual simulation run and the actual simulation results analysis.

A reactive testbench is a testbench the properties of which change in response to prior tests/analyses. The properties in analog testbenches include test (simulation) conditions, design variables, PVT (process/device models, power supply voltages, and circuit temperatures) and all underlying simulator parameters. Reactive testbenches are commonplace today in digital circuit design testing, e.g., directed-random testbenches in IEEE 1800-2005 System Verilog.

Analog circuit designers have been working with a testbench on an interactive verification system/environment such as Cadence Analog Design Environment (ADE). Users define a testbench, run simulation and analyze the results in such a system, one testbench at a time. When results of a particular testbench need to be passed to the next testbenches, typically it has been done manually by entering the measured results of the first testbench when defining the next testbenches. Testbench definition on such a system is done by setting the configurations; the system internally uses the configuration information to determine exactly what to do and how to do it. That is, users control the system's detailed operations on the testbench by setting the configurations. Such a system may intermediately generate a script language program to define and operate on a testbench. Some advanced users may actually change/modify the program for some sophisticated operations, but the basic mode of operation is unchanged for the most part.

Recently, more advanced systems, such as Cadence ADE-XE/GXE, are available that allow users to define and operate on multiple testbenches at the same time. In ADE-XL and ADE-GXL, individual testbenches are primarily stand alone in the sense that they are not communicating with each other. ADE-XL/GXL do provide some mechanisms for the testbenches to communicate. One such mechanism is using a global variable the value of which a testbench updates; all other testbenches that have the same variable name automatically use the updated value. The communication mode is basically broadcasting. Another mechanism in ADE-XL/GXL is using a function called "calcVal( )" in individual testbenches that need to use the results of other testbenches. This communication is point-to-point, defined in the receiver testbench definition. That is, the communication is fixed in the communication expressions during the life of the testbenches until they are changed in the testbench definitions.

Users work with testbenches on ADE-XL/GXL interactively, one session at a time. A session may involve multiple testbenches. Users interact with the system by setting the configurations (also called environments). As in ADE, the system may dump out a script language program for user's modification, but the fundamental mode of operation is largely the same.

SUMMARY OF THE INVENTION

The present invention provides an Algorithmic Reactive Testbench (ART) system. The ART system is a simulation/verification environment for an analog integrated circuit design, using an algorithmic reactive testbench program in which one or more analog testbenches are instantiated and operated to simulate the analog integrated circuit design, and the properties of the unit testbenches (test objects) can be influenced by prior analysis of themselves or other tests associated with the analog integrated circuit design. A test object is a representation of a unit testbench along with its complete simulation setup and all associated data for the simulation of the analog integrated circuit design. The test object may also contain various properties including information reflecting the status of the test object, and including changing the properties of the test object as a result of execution of the algorithmic reactive testbench program. The modification of a property of a test object is an act of communication in the ART system from the algorithmic reactive testbench program to the test object.

The features and advantages of the various aspects of the present invention will be more fully understood and appreciated upon consideration of the following detailed description of the invention and the accompanying drawings, which set forth an illustrative embodiment in which the concepts of the invention are utilized.

DETAILED DESCRIPTION OF THE INVENTION

Figure 1:
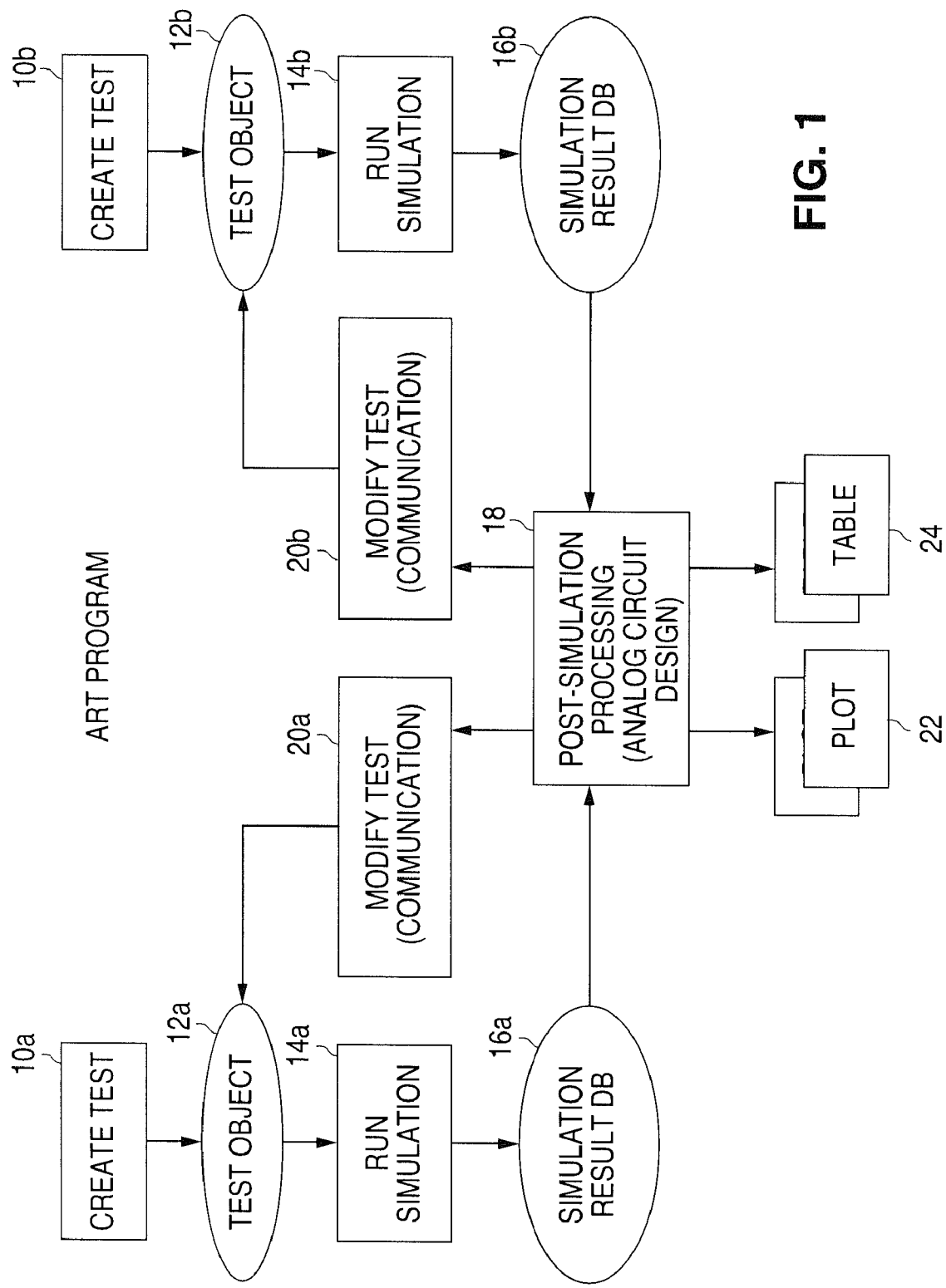
FIG. 1 is a flow chart illustrating an algorithmic reactive testbench technique for analog designs in accordance with the concepts of the present invention.

An analog testbench or test specification may be seen as a self-contained object for its simulation. That is, the object is a self-contained, stand-alone unit or entity for its internal operations (methods in object-oriented programming terminology) such as its simulation operation. It is referred to herein as a test object. The test object contains various properties and methods.

In this object-orient view of an analog testbench and test specification, we also consider the changes in the properties of the testbench (such as simulation setup) as inputs to the testbench (and its tests) or test object that is otherwise largely self-contained. In other words, the inputs to the testbench are anything that might change or influence the simulation and the simulation results. Outputs of the analog testbench (and its tests) are simulation results and their post-simulation analysis results, if any.

By feeding the outputs of the one or plurality of analog testbenches to their inputs, that is, changing their properties based on prior analyses results of themselves or others, we can obtain a reactive network or system of analog testbenches. We refer to a testbench with such a reactive network of analog testbenches or test objects as a reactive testbench or a reactive analog testbench in this document.

An Algorithmic Reactive Testbench (ART, alias Analog Reactive Testbench) is a reactive testbench in which the reactive network and operations of the reactive testbench on the reactive network are algorithmically described in a user (application) program (hereinafter, an ART program or algorithm) that is executed algorithmically as prescribed in the program on an appropriate environment or platform (hereinafter, an ART programming/execution environment). Unlike traditional reactive system, the reactive network in ART is not necessarily autonomous, although it can be achieved in ART if desired. An ART program (with all its associated data) and its execution environment form a complete Algorithmic Reactive Testbench system.

ART is a high level verification environment with a user program in which one or more analog testbenches are instantiated and operated as prescribed in the program algorithm, and the properties of the unit testbenches (test objects) can be influenced by prior analysis of themselves or other tests. The analyses results may also affect the flow of the program itself. In ART, modification of the properties of a unit testbench occurs separately in the program after the definition (i.e., instantiation/creation) of the unit testbench in the program. The definition/instantiation of the testbench in the program is referred to in this document as a test object. A test object is a representation of a unit testbench along with its complete simulation setup and all associated data for the simulation. The test object may also contain various properties including some information reflecting the status of the test object. The modification of a property of a test object is an act of communication in ART from the ART program to the test object.

In ART, the modification/communication is an assignment statement executed procedurally in the program, operationally separate from the test object definition/instantiation in the program. The execution of the assignment statement changes a property in the subject test object with a new value obtained in the evaluation of the assignment statement in the program. That is, a value, rather than an expression, is passed to the test object. Such as assignment communication to a test object can freely occur anytime anywhere in the program after the creation of the test object. Each assignment communication may pass a different value from different source. In other words, the communication/value-passing in ART are events in the program, semantically separate from the definitions/instantiations of the destination test objects. The events may involved source test objects in the communication assignment expressions.

Test objects can be (re)created in an ART program anytime anywhere in the program. When they are being (re)created, they may take values from the program for their properties. Those values can be constants or variables in the program, the values of which are evaluated from expressions that may involve prior tests and/or analyses results. That is, values may be passed from the ART program to test objects when the test objects are (re)created. This is another (altered) form of communication from the ART program to the test object. But even in this case, values are passed to the test objects, not communication expressions, when they are being (re)created in the ART program.

Test objects can be executed of their simulations (i.e., simulation methods) or other operations (i.e., methods) defined in or for them after their creation in the program. In ART, the simulation execution of test objects can be explicit in the program or implicit/indirect in the program. Simulation operation of a test object can occur anytime (and any number of times) anywhere in the ART program after the test object's creation with its appropriate setup. Some properties of the test objects may be changed to reflect their status as a result of their simulation execution or to accommodate post-simulation processing results in the test objects such as parsed simulation database and waveform plots. These updates can be initiated by the test objects themselves when they are executed or explicitly initiated in the ART program.

In ART, communication from test objects to their host ART program occurs when the program accesses the properties or execution results of the test objects. It occurs in the program when an expression involving the test objects' properties or prior simulation/analyses results is evaluated. The evaluated results may be passed to other test objects (or themselves) or saved in variables in the program for later use. In ART, value-passing is visible on the ART program, which can be used in parallel or distributed processing of the program to speed up the execution.

An ART (Algorithmic Reactive Testbench, aka Analog Reactive Testbench) program sets up an analog test (i.e., test specification), initiates simulation of the test, performs simulation results analyses, and then passes the analyses results to succeeding tests that may include itself. An ART program is a user algorithm, rather than a software tool or a configuration (a set of user application settings) to such a tool, to perform a sequence of tests in a prescribed manner. In contrast, a configuration dictates to a software tool what to do. Unlike the configuration, the program in ART describes not only what to do, but also how to do at high level.

Referring to the FIG. 1 flow chart of an ART testbench program in accordance with the concepts of the present invention, unit analog testbench simulation test packages are created and packaged into corresponding self-contained objects that are referred to hereinafter as test objects. The FIG. 1 flow chart references steps 10a and 10b for the creation of two such simulation test packages by the ART program that are then packaged into corresponding test objects 12a and 12b, respectively. Although only two test objects 12a and 12b are shown in FIG. 1, those skilled in the art will appreciate that the ART program may include any number of such test objects. Each test object (12a, 12b) contains analog simulation input properties (i.e., data, including the unit analog simulation testbench netlist), an analog simulation method (an operation property) for that test object, and the simulation output properties (results data). Thus, each test object (12a, 12b) is self-contained in the sense that its simulation method operates upon the state properties within the test object together with any function argument values that are provided to the test object with the invocation of its simulation method. Other than any such values provided as function arguments, the simulation method for a particular test object does not access or use any state properties or variables from outside that particular test object. After a simulation of a test object has been run (reference numerals 14a and 14b in FIG. 1), the simulation results for that run are retained in the test object (12a, 12b). New values (reference numerals 16a and 16b in FIG. 1) that result from the simulation are provided to post simulation processing 18 in the ART program may be passed as a modified test communication (reference numerals 20a and 20b in FIG. 1, to any test object in the ART program from outside that test object to update the simulation input properties of that test object. As further shown in the FIG. 1 flow chart, the simulation results (i.e., output properties) may be provided as, for example, a plot 22 or a table 24 for assessment of a test object by the outside world after simulation of that test object.

An embodiment of an Analog Reactive Testbench has been demonstrated in a subsystem of ATA (Analog Testbench Automation). The subsystem is called ATA Program's Abstract Machine (PAM). PAM is an environment for executing user's ART programs (PAM programs). PAM along with its supported user programming language and user's application PAM program in that language is an implementation/embodiment of ART.

An example user's PAM program is shown and described below.

```
newtest test 1__1 tran comp__top__siml.scs start=0.1 stop=0.2 step=0.001
    save='vo a6 a10';
newtest test 1__2 tran comp__top__siml.scs start=0.25 stop=0.35
    step=0.001 save='vo a6 a10';
newtest test2__1 tran comp__top__sim2.scs start=0.09e-3 stop=0.11e-3
    step=1e-6 save='vo vp vn';
```

Three test objects named test1__1, test1__2, and test2__1 are created by the three statements above. Statements are separated by semicolon ";". They are all tran mode simulations with their own testbench netlists (the third arguments). The rest of arguments are the options to the underlying simulator, Spectre in this case.

```
newplot test1__1 title='Threshold Vthp' grid=True ylabel=' Volts';
run test1__1;
plot test 1__1;
var[ 'vthp'] = ycrossingx test1__1 vo a10-a6 1.5;
spec vthp__spec var [ 'vthp'] [ 0] min=.06 max=.07;
```

We entered a waveform plot specification to the test1__1 test object followed by running simulation of test1__1. Then we obtain a simulation plot of test1__1. We also measure the differential signals (a10-a6) when the signal vo crosses a reference value of 1.5. The resulting values (solutions) are saved in a user variable var ['vthp']. Then we check the first solution if it meets the spec by being within the range of minimum 0.06 and maximum 0.07.

```
run test1__2;
newplot test1__2 title='Threshold Vthn' grid=True ylabel='Volts';
plot test1__2;
var[ 'vthn'] = ycrossingx test1__2 vo a10-a6 1.5;
spec vthn__spec var[ 'vthn'] [0]
```

Here, we run simulation of test1__2 first followed by a plot specification, actual plotting, and vthn value measurement and its spec check.

```
setvar test2__1 vthp = ycrossingx test1__1 vo a10 1.5;
valuepassing test2__1 vthn = yc test1__2 vo a6 1.5;
run test2__1;
newplot test2__1 title='Tprop,lh' grid=True ylabel='Volts';
plot test 2__1;
```

-continued

```
var[ 'test2__1__vo__cross'] = yc test2__1 vo time 1.5;
var[ 'test2__1__vpn__cross'] = yc test2__1 vp-vn time 0.038;
var[ 'tprop__lh'] = var[ 'test2__1__vo__cross'] [ 0] –
    var[ 'test2__1__vpn__cross'] [ 0];
```

The first two statements here measure the input signals' values when vo signal crosses the reference 1.5 from tests test1__1 and test1__2. (yc is an alias to ycrossingx.) These values are passed to test2__1 test object on its properties vthp and vthn, respectively, (setvar and valuepassing are synonymous.) Then we run simulation of test2__1 followed by a plot specification, actual plotting, and some waveform measurements. The last three statements measure a delay time from the differential input signals vp-vn crossing the reference 0.038 to the output signal vo crossing its reference 1.5. The computed delay time is saved in the user variable var['tprop__1h'].

printvar;

checkout;

The printvar instruction show all user variables with their values. The checkout instruction returns the results of all spec checks entered. The results of these instructions are following:

```
PAM statement: printvar
ata> printvar ( )
vthp is [ 0.064670000000000005]
vthn is [ –0.0020700000000000163]
test2__1__vo__cross is [ 0.000101511]
test2__1__vpn__cross is [ 0.0001]
tprop__lh is 1.511e-06
PAM statement: checkout
ata> checkout ( )
vthp__spec:    min= 0.6 , actual= 0.06467 , max= 0.07 , Result= Pass
vthn__spec:    min= None , actual= –0.00207 , max- None , Result- N/A
```

It should be understood that the particular embodiments of the invention described above have been provided by way of example and that other modifications may occur to those skilled in the art without departing from the scope and spirit of the invention as express in the appended claims and their equivalents.

What is claimed is:

1. A method of simulating an analog integrated circuit design utilizing an algorithmic reactive testbench simulation system, the method comprising:

creating at least one unit testbench for the analog integrated circuit design, the unit testbench being represented as a self-contained test object that contains associated test object properties for associated test object operations;

initiating performance of the associated test object operations; and in response to the initiated performance of the associated test object operations, making changes in the associated test object properties of the self-contained test object by passing values resulting from performance of the associated test object operations to the unit testbench, wherein the step of initiating performance of the associated test object operations and the step of making changes in the associated test object properties by passing the resulting values to the testbench are prescribed in an algorithmic reactive testbench program that is executed in the algorithmic reactive testbench simulation system.

2. The method of claim 1, wherein the associated test object operations include test object simulation of the self-contained test object.

3. The method of claim 1, wherein the step of passing the resulting values to the testbench occurs in the algorithmic reactive testbench program when the resulting values define or re-define the self-contained test object.

* * * * *

UNITED STATES PATENT AND TRADEMARK OFFICE
CERTIFICATE OF CORRECTION

| | | |
|---|---|---|
| PATENT NO. | : 7,853,908 B2 | Page 1 of 1 |
| APPLICATION NO. | : 11/899215 | |
| DATED | : December 14, 2010 | |
| INVENTOR(S) | : Jang Dae Kim et al. | |

It is certified that error appears in the above-identified patent and that said Letters Patent is hereby corrected as shown below:

In the Claims:
In column 7, line 5, claim 2 after the word "include", please delete "test object".

Signed and Sealed this
Twenty-fifth Day of January, 2011

David J. Kappos
*Director of the United States Patent and Trademark Office*